United States Patent [19]

Ishii et al.

[11] Patent Number: 5,122,679

[45] Date of Patent: Jun. 16, 1992

[54] INTEGRATED LOGIC CIRCUIT WITH CLOCK SKEW ADJUSTERS

[75] Inventors: Shuichi Ishii, Sayama; Tatsuya Kimura, Ohme, both of Japan

[73] Assignee: Hitachi, Ltd., Tokyo, Japan

[21] Appl. No.: 421,066

[22] Filed: Oct. 13, 1989

[30] Foreign Application Priority Data

Oct. 14, 1988 [JP] Japan .................... 63-259114

[51] Int. Cl.⁵ .................... H03K 5/13; H03K 3/01
[52] U.S. Cl. .................... 307/269; 307/262; 328/63; 328/72; 328/155
[58] Field of Search ............ 307/269, 262, 271, 482.1; 328/63, 72, 155; 375/110

[56] References Cited

U.S. PATENT DOCUMENTS 4,309,649 1/1982 Naito .................... 307/510
4,495,473 1/1985 Treise .................... 328/155

FOREIGN PATENT DOCUMENTS 63-231516 9/1988 Japan .

OTHER PUBLICATIONS

Anceau, "A Synchronous Approach for Clocking VLSI Systems", IEEE SSC, vol. SC-17, No. 1, Feb. 1982.
NEC Technical Report, Aug. 1983, "Ultrahigh-Speed ECL Gate Array Family", pp. 1-12, T. Takahashi et al.

Primary Examiner—Timothy P. Callahan
Attorney, Agent, or Firm—Fay, Sharpe, Beall, Fagan, Minnich & McKee

[57] ABSTRACT

In an integrated logic curcuit, a plurality of clock skew adjustors generate clocks having coincident phases in reaponse to frequency information and phase information fed from a clock source. These clock source and clock adjustors are arranged so that their individual signal delays may be substantially equalized.

20 Claims, 5 Drawing Sheets

INTEGRATED LOGIC CIRCUIT WITH CLOCK SKEW ADJUSTERS

BACKGROUND OF THE INVENTION

The present invention relates to a clock adjusting technique and, more particularly, to a technique which is effective especially when applied for coping with the skew in case a clock is fed from one clock source to a plurality of elements. The present invention is effective when used in a computer or a logical LSI composing the computer.

The system such as the computer has its operations speeded up by feeding a common clock from one clock source to a number of LSIs composing the system to latch the data in synchronism with a master clock.

In the system of the prior art, however, the clock feed system is of the so-called "incontinent type", and the distances from the clock source to the individual logical LSIs are different so that clock skews are caused. In order to prevent the latch of the error data due to the skew, therefore, the design of the prior art has been drawn to afford a considerable margin of the latch timing and so on.

Incidentally, the provision of a plurality of phase adjustor means for receiving clocks from a clock source is disclosed in Japanese Patent Laid Open No. 63-231516 (corresponding to U.S. Ser. No. 152,916).

Moreover, the technique for reducing the interclock skews is disclosed on pp. 85 to 90 of "NEC Technical Report" issued in August, 1983 by K.K. Nippon Denki.

SUMMARY OF THE INVENTION

If the signal transmission delays become different due to the difference in the distances to the individual circuits made receptive of clocks from the clock source, the margin based on the delay difference has to be considered in the design of the aforementioned latch timing. As a result, the operating speed of the system is delayed in an extent of the timing margin, and this delay is the more influenced by the larger scale of the system, as has been clarified by our investigations.

An object of the present invention is to reduce the clock skew in the clock-synchronized type system thereby to speed up the system.

The aforementioned and other objects and novel features of the present invention will become apparent from the following description to be made with reference to the accompanying drawings.

The representatives of the invention to be disclosed will be summarized in the following.

In a plurality of positions of the system, there are arranged clock skew adjustors each of which includes variable clock delay means, phase comparator means and a frequency divider, and the wiring distances between one clock source and the individual clock skew adjustors are substantially equalized. The variable delay means is controlled by feeding a common frequency information and a phase information signal to the individual clock skew adjustors from one clock source to feed the adjusted clock to a flip-flop or the like and by feeding back the clock from the clock input terminal of a destination circuit to the phase comparator of the clock skew adjustor to detect the phase difference from the phase information signal so that the phase difference may be reduced to zero.

According to the means described above, it is possible to prevent the signal transmission delay difference between the clock source and the individual clock skew adjustors. On the basis of the phase information from the clock source, the clocks having their phases coincided with the reference clock are generated by the individual clock skew adjustors and are fed to the individual clocked device portions of the circuit. As a result, the clock skews can be reduced more than in the system in which clocks are fed from one clock source directly to a number of destinations.

DESCRIPTION OF THE PREFERRED EMBODIMENTS

Figure 1:
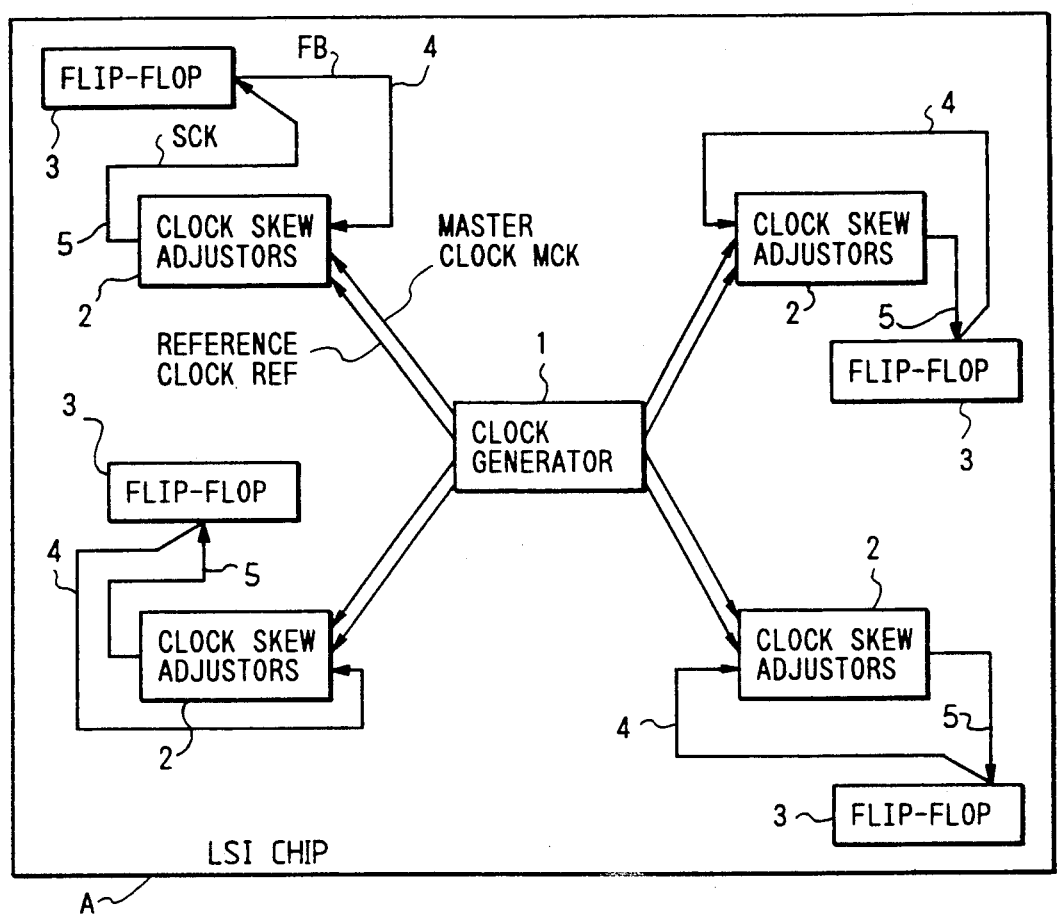
FIG. 1 is a block diagram showing the structure of the portion of a logical LSI, to which is applied a clock skew adjusting system of the present invention.

FIG. 1 shows one embodiment in which the present invention is applied to the system of an LSI.

Specifically, each circuit block enclosed by solid lines A is formed over one semiconductor chip such as a single-crystalline silicon substrate.

Figure 4:
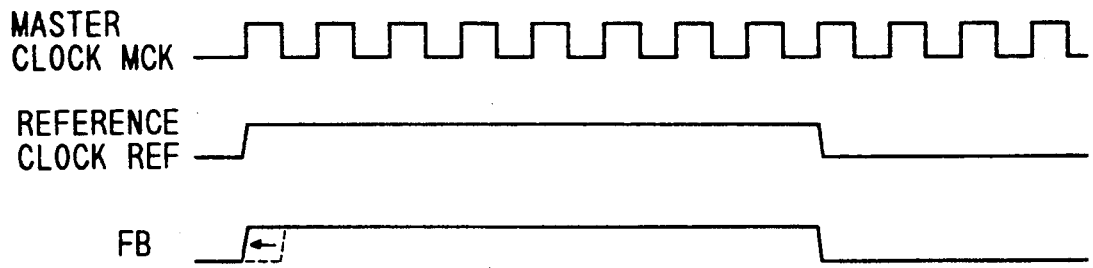
FIG. 4 is a timing chart showing the input and output timings of the clock skew adjustor.

In the present embodiment, a clock generator 1 is disposed at the center of the LSI chip A, although not limitative thereto. From this clock generator 1, there are generally equidistantly spaced four clock skew adjustors 2. A master clock MCK for frequency information and a reference clock REF having its frequency divided into one sixteenth the frequency of that of the master clock MCK as shown in FIG. 4, and the clock REF is used for phase information are fed from the clock generator 1 to the individual clock skew adjustors 2. Slave clocks SCK are prepared on the basis of the master clocks MCK and are fed on signal lines 5 from the individual clock skew adjustors 2 to flip-flops 3 which are clocked devices disposed in the vicinity of and desired to be timed with the clock skew adjustors 2. Moreover, signal lines 4 are formed to feed back the fed clocks from the clock input terminals of the flip-flops 3 of the clocks SCK as feedback signal FB to the clock skew adjustors 2 of the supply source.

Figure 2:
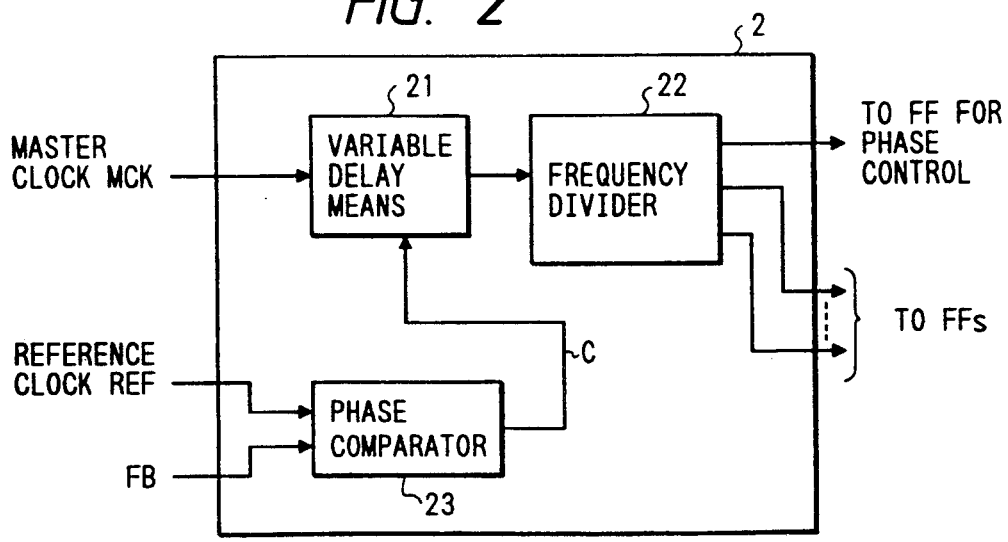
FIG. 2 is a block diagram showing one example of the clock skew adjustor.

FIG. 2 shows an example of the structure of each of the aforementioned clock skew adjustors 2.

Figure 3:
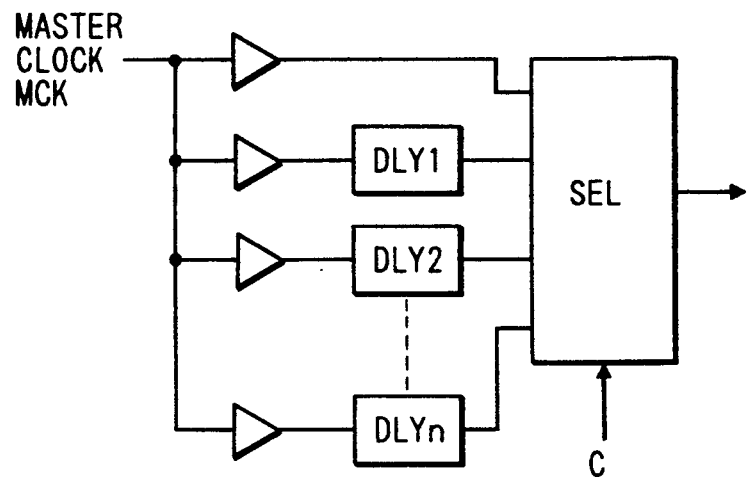
FIG. 3 is a circuit diagram showing one example of variable delay means constituting the clock skew adjustor.

Specifically, each clock skew adjustor 2 is constructed to include: variable delay means 21 capable of delaying an input signal such as the master clock MCK by an arbitrary time within one clock period, for example; a frequency divider 22 for dividing the frequency of the master clock MCK delayed by the variable delay means 21; and a phase comparator 23 for detecting the phase difference between the reference clock REF or the phase information coming from the clock generator 1 and a feedback signal FB coming from the clock destination or the flip-flop 3, (FF). The phase comparator 23 feeds the aforementioned variable delay means 21 with a signal C according to the phase difference between the reference clock REF and the feedback signal FB. The variable delay means 21 is constructed, as shown in FIG. 3, to include: a plurality of delay means DYL1, DYL2, - - -, and DLYn having their individual delays set to have different amounts; and a selector SEL for selecting one of the delay means to transmit the master clock MCK. The delay means for transmitting the master clock MCK is so determined that the phase difference may be reduced to zero in accordance with the signal coming from the phase comparator 23 and indicating the phase difference.

In the clock feed system of the embodiment described above, the signal FB to be fed back to the phase comparator 23 is the slave clock SCK fed to the clock input terminal of the destination flip-flop. If the clock skew adjustor 2 and the flip-flop 3 are positioned close to each other, there is little delay in the clock to be fed back. As a result, the slave clock SCK to be outputted from the clock skew adjustor 2 is instantly corrected to reduce its phase difference to zero even if it has a phase difference from the reference clock REF, with FB before adjustment being as indicated by broken line in FIG. 4. Moreover, the common phase information is given from the clock generator 1 to all the clock skew adjustors 2 in the LSI so that the individual flip-flops 3 are simultaneously operated with the clocks in phase, even if the skew adjustors 2 for receiving the clocks are different.

Figure 5:
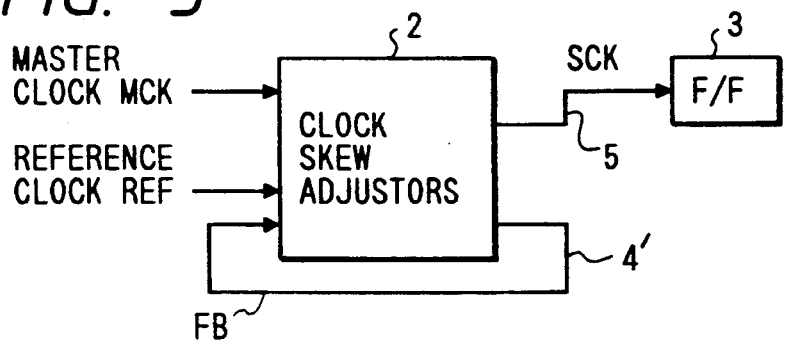
FIG. 5 is a circuit diagram showing another feedback type example of the clock skew adjustor.

In the embodiment described above, the slave clocks, which are fed from the clock skew adjustor 2 to the clock input terminal of the flip-flop 3, are fed back as feedback signal FB. This feedback may be accomplished by providing the feedback signal line 4' which has a length equal to a clock feed signal line 5 running from the clock skew adjustor 2 to the flip-flop 3, as shown in FIG. 5 as a variation of the FIG. 1 structure. Thus, the inter-clock skews can be reduced to zero even if the signal lines 5 have different lengths for the flip-flops.

Incidentally, in order to facilitate the detection of the phase difference in the phase comparator 23, the foregoing embodiment may be exemplified by equalizing the frequency of the reference clock REF to that of the slave clock SCK to be fed to the flip-flop. On the other hand, the master clock MCK may be several times (preferably, the power of 2) as high as the frequency of the reference clock REF. In the embodiment, therefore, the master clock MCK having a frequency of sixteen times as high as that of the reference clock REF is generated by the clock generator 1 and is fed to each of the clock skew adjustor 2. The master clock MCK thus fed has its frequency divided into one sixteenth by the clock skew adjustor 2 to produce slave clock SCK that is fed to the flip-flop 3.

In case the present invention is applied, moreover, the clock skew adjustors 2 may be provided for all the flip-flops 3. Since, however, an increase in the number of the flip-flops will increase the chip size accordingly, the number of the clock skew adjustors may be reduced by selecting the flip-flops for feeding back the clocks to the clock skew adjustors 2. The manner how to determine the flip-flop in this case is exemplified by a method of selecting the flip-flop on a critical path for exerting direct influences upon the operating speed of the system or by dividing the internal circuit of the LSI into a plurality of blocks to select the flip-flop at the center of each block as a representative.

In the present embodiment, as has been described hereinbefore, there are arranged in the plural positions of the system the clock skew adjustors each of which is constructed to include the variable clock delay means, the phase comparator and the frequency divider, and the common frequency information and the phase information signal are fed from the one clock source to the individual clock skew adjustors. The signal lines for transmitting the common frequency information (MCK) are substantially equalized, and the signals lines for transmitting the phase information signal (REF) are also substantially equalized, so that the clock skews can be reduced. Moreover, the clocks are fed back from the clock input terminals of the circuits, which are fed with the output signals of the clock skew adjustors, to the phase comparators of the clock skew adjustors so that the variable delay means may be operated by detecting the phase differences from the phase information signal to reduce the detected phase differences to zero. On the basis of the phase information coming from the clock source, each clock skew adjustor generates and feeds clocks in phase with the master clock to the individual portions. As a result, the clock skews can be reduced more than those of the system in which the distances from one clock source are difference and in which the clocks are fed to a number of destinations directly not through the clock skew adjustors. As a result, the timing margin in the system design can be reduced to speed up the system.

Although our invention has been specifically described in connection with the embodiment thereof, it should not be limited thereto but could naturally be modified in various manners without departing from the gist thereof. For example, the frequency divider 22 in the clock skew adjustor 2 is not indispensable but could be omitted. Moreover, the clock to be fed from the clock source 1 to the clock skew adjustor need not be divided into the two clocks, i.e., the master clock MCK for the frequency information and the reference clock REF for the phase information could be one clock for both the frequency information and the phase information.

In the description thus far made, our invention has been described in case it is applied to the logical LSI or its background field having its internal circuit operating in synchronism with clocks. However, the present invention should not be limited to that case but can be employed in a computer or another clock-synchronized type system which is constructed of a plurality of LSIs mounted on a board such as a ceramic substrate or by combining such boards.

On the other hand, the distances between the clock source and the individual clock skew adjustors need not be substantially equalized but might have their signals delays substantially equalized.

Figure 6:
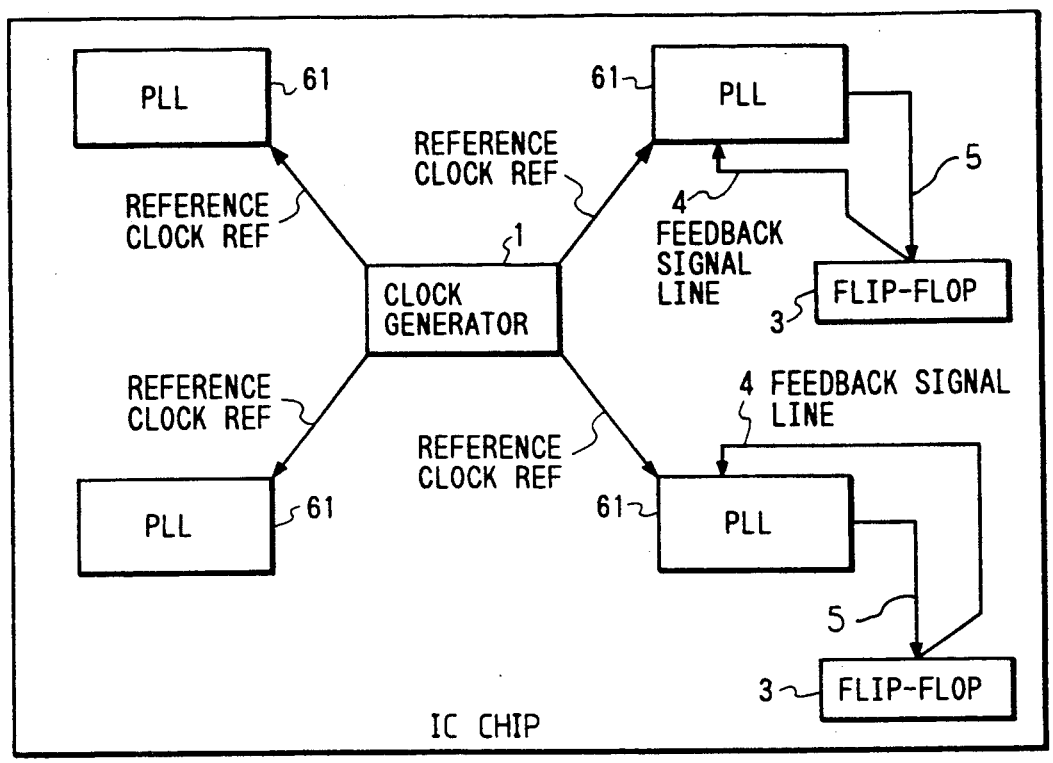
FIG. 6 is a block diagram showing another embodiment of the present invention.

FIG. 6 shows another embodiment of the present invention. According to this embodiment, a plurality of phase locked loop circuits PLL 61 are arranged at substantially equal distances from the clock generator 1 so that the reference clocks REF and the signals fed back from the flip-flops 3 may be in phase with each other. Since all the delays of the feedback signal lines 4 are equalized, the phases of the clocks to be fed to the individual flipflops can be made accurately coincident.

Figure 7:
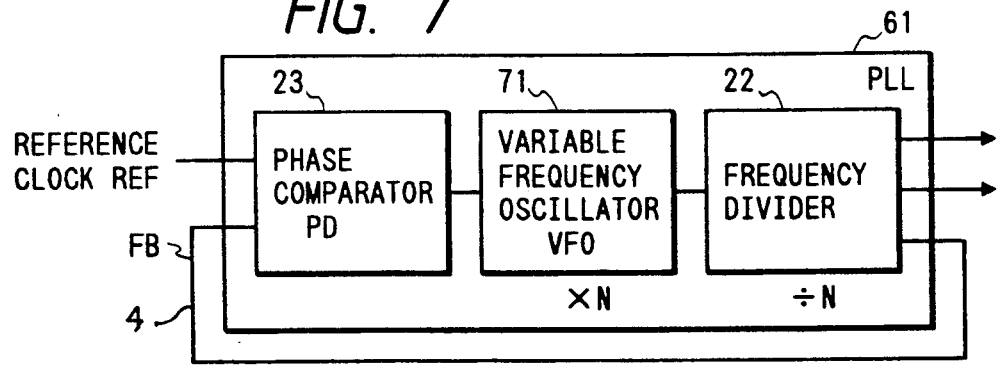
FIG. 7 is a block diagram showing one embodiment of the PLL circuit shown in FIG. 6.

FIG. 7 is a block diagram showing the inside of the PLL 61. This PLL 61 can be constructed of the phase comparator 23, a variable frequency oscillator VFO 71 and the frequency divider 22. The VFO 71 produces a signal having a frequency N times as high as that of the input signal, and the frequency divider 22 produces a signal having a necessary frequency of N to 1 times. To the feedback signal line 4, there is returned a signal FB having a frequency of $N \times 1/N$ times, i.e., a frequency equal to that of the reference clock REF.

Figure 8:
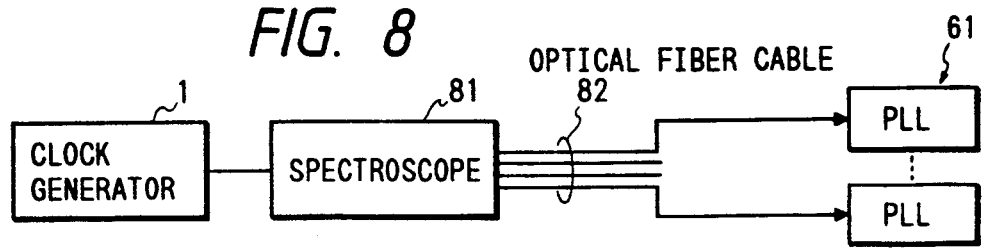
FIG. 8 is a block diagram showing still another embodiment of the present invention.

FIG. 8 shows an embodiment in which the clock generator 1 and each of the PLL circuits 61 are coupled through a spectroscope 81 and an optical fiber cable 82. The dispersion of the signal transmission delay can be reduced by making use of the high velocity, steep rise and breakdown characteristics of the light. This arrangement is effective especially in case the clock generator 1 and the individual PLL circuits 61 are formed over different IC chips so that the distances between the clock generator 1 and the PLL circuit 61 are large.

In the embodiment of FIG. 8, the PLL circuits 61 can be replaced by the clock skew adjustors shown.

Figure 9A:
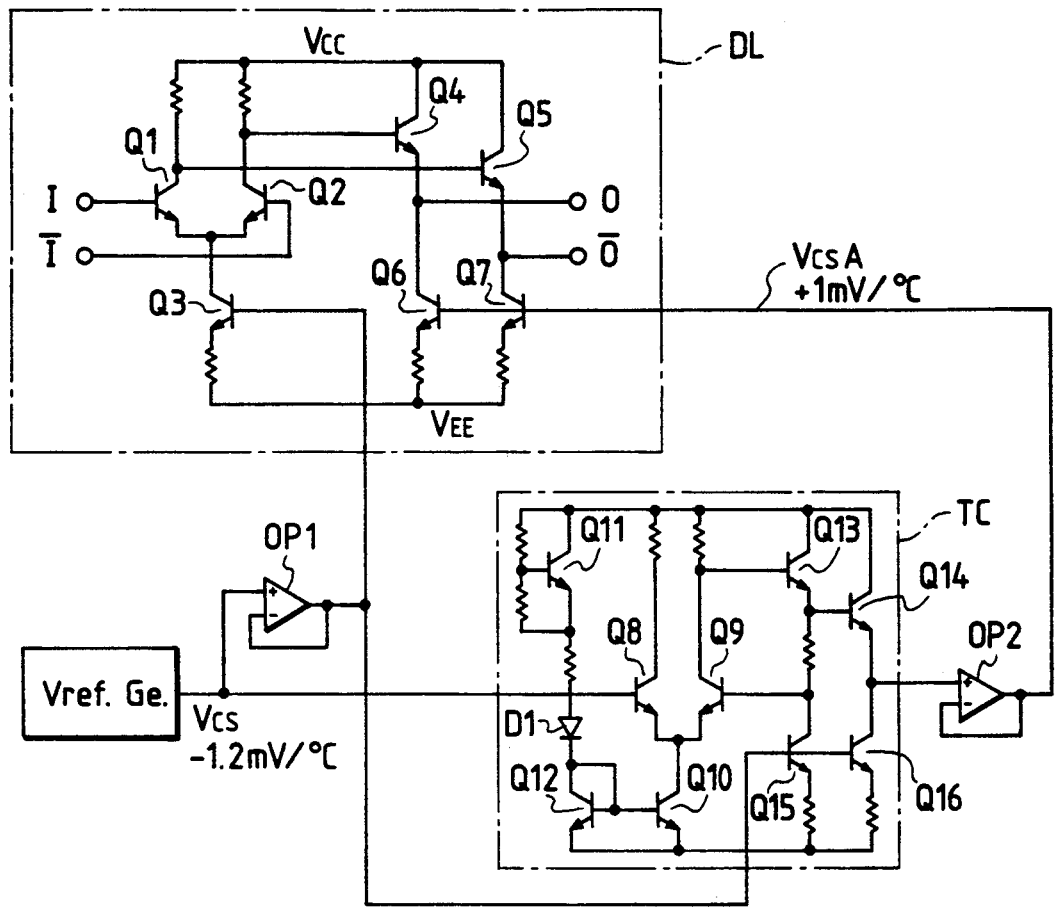
FIG. 9A is a circuit diagram showing one embodiment of the delay means shown in FIG. 3.
Figure 9B:
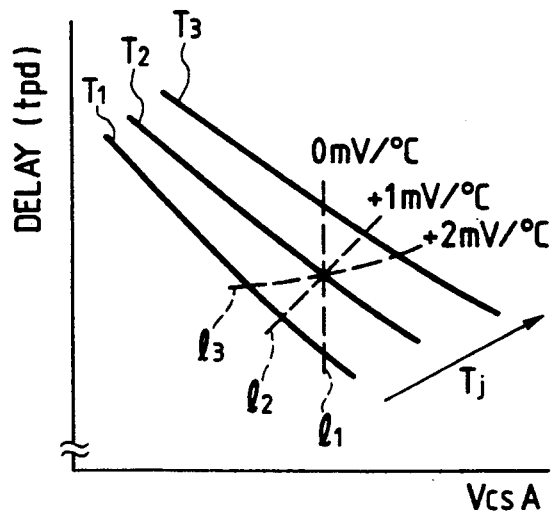
FIG. 9B is a characteristic diagram for explaining the operations of the delay means of FIG. 9A.

FIG. 9A shows one embodiment of the delay means DLY1 shown in FIG. 3. This embodiment is equipped with a temperature compensator TC for adjusting the temperature characteristics of a delay circuit DL. This delay DL is constructed to include: a pair of differential transistors Q1 and Q2 made receptive of differential input signals I and `I; a shared current source transistor Q3; emitter-follower transistors Q4 and Q5 for sending out differential output signals O and `O; and current source transistors Q6 and Q7. The temperature compensator Tc is constructed to include: a pair of differential transistors Q8 and Q9; a shared current source transistor Q10; output transistors Q13 and Q14 connected in the Darlington connection; current source transistors Q15 and Q16; and transistors Q11 and Q12 and a diode D1 for producing a base reference voltage of the aforementioned common current source transistor Q10. The output signal of the temperature compensator TC is fed through a voltage follower circuit OP2 to the bases of the transistors Q6 and Q7. The voltage $V_{CSA}$ thus fed has a temperature coefficient set at 1 to 2 mv/°C. With this temperature coefficient, the delay time $t_{pd}$ resulting from the temperature rise can be negated by the improved drive powers of the emitter follower transistors Q4 and Q5. FIG. 9B plots the delay time $t_{pd}$ against the voltage for the parameters of the temperature. In case the temperature rises in the order of T1, T2 and T3, the delay $t_{pd}$ drastically increases, as indicated at broken curve 11, for the temperature coefficient of 0 mV/°C. of the voltage $V_{CSA}$. If, on the other hand, the temperature coefficient of the voltage $V_{CSA}$ is at 1 mV/°C., the delay $t_{pd}$ is as indicated by z. If the temperature coefficient of the voltage $V_{CSA}$ is at 2 mV/°C., the delay $t_{pd}$ hardly increases, as indicated by broken curve 13. It is ideally desired that $at_{pd}/aTj=0$, with $T_j$ being the junction temperature. According to the present circuit, $at_{pd}/aT_j=0.1$ to 0.15%/°C. can be obtained by controlling the voltage $V_{CSA}$.

In FIG. 9A, moreover, a reference voltage generator $V_{ref}G_e$ produces a reference voltage $V_{CS}$ having a temperature coefficient of $-1.2$ mV/°C., which is fed not only to the bases of the aforementioned transistors Q15, Q16 and Q8 but also through a voltage follower OP1 to the base of the aforementioned transistor Q3.

Figure 10A:
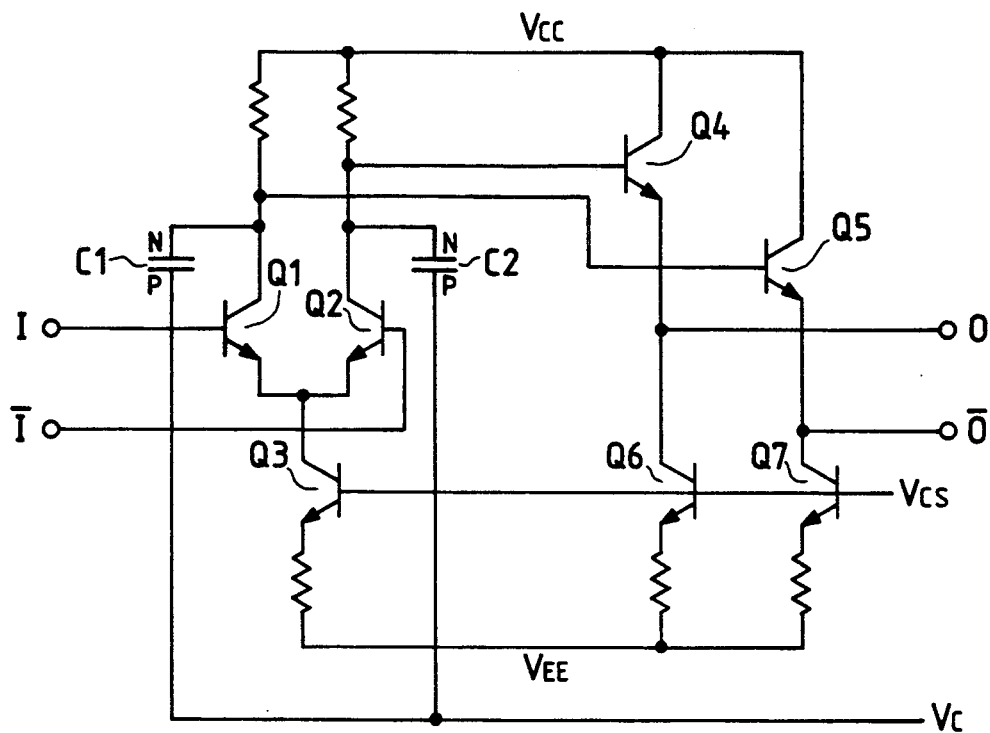
FIG. 10A is a circuit diagram showing another embodiment of the aforementioned delay means.

FIG. 10A shows another embodiment of the delay means DLY1 shown in FIG. 3. Since the circuit of the present embodiment and the delay circuit DL shown in FIG. 9A are basically composed of the common components, the corresponding components are designated at the identical reference characters. The difference from the delay circuit DL resides in that junction capacitors C1 and C2 are connected with the collector resistance portion sensitive to the circuit speed to compensate the delay in accordance with a bias voltage Vc applied.

Figure 10B:
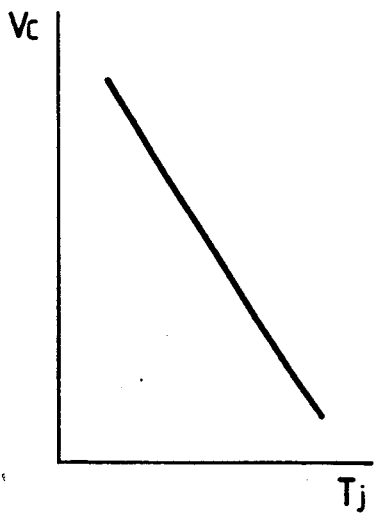
FIGS. 10B and 10C are characteristic diagrams for explaining the operations of the delay means of FIG. 10A.
Figure 10C:
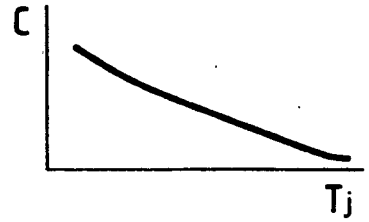

FIG. 10B plots the bias voltage Vc against the temperature Tj, and FIG. 10C plots the capacitance C of the junction capacitors C1 and C2 against the temperature Tj. The delay due to the temperature rise can be negated by setting the term av/aTj negative, as shown in FIG. 10B, and by setting the term aC/aTj negative, as shown in FIG. 10C.

While a preferred embodiment has been set forth along with modifications and variations to show specific advantageous details of the present invention, further embodiments, modifications and variations are contemplated within the broader aspects of the present invention, all as set forth by the spirit and scope of the following claims.

What is claimed is:

1. An integrated logical circuit, comprising:
   clock means for feeding a clock having frequency information and phase information;
   a plurality of clock adjustor means for respectively generating clock signals having the same phases in response to the frequency information and phase information fed from said clock means;
   clocked devices receiving the clock signals; and
   means for maintaining delay times between said clock means and said clock signals of each clock adjustor means to be substantially equal, including feedback means responsive to said clock signals fed back from said clocked devices for producing feedback signals having a delay correlated to transmission delay of said clock signals, respectively for each of said clock adjustor means, and
   each of said clock adjustor means includes phase comparator means for detecting a phase difference between the clock and a respective one of said feedback signals and includes variable delay means for delaying the clock in accordance with said phase difference to produce a respective one of the clock signals;
   wherein said clock means feeds a reference clock having one frequency with said phase information and a different master clock having said frequency information with a frequency higher than said one frequency;
   wherein each of said clock adjustor means further includes a frequency divider for dividing the master clock which has been delayed by said variable delay means;
   wherein each of said variable delay means includes a plurality of delay circuits each responsive to said clock and producing respective output signals having different delay times, and a selector for selecting one of the outputs signals as the respective ones of said clock signals.

2. An integrated logical circuit according to claim 1, wherein each of said delay circuits has an emitter-follower circuit for generating a respective one of the output signals, and said emitter-follower circuit has means to compensate for delay time temperature-dependency.

3. An integrated logical circuit according to claim 2, wherein each of said delay circuits has a reference voltage source having a temperature coefficient and an emitter current source each connected to said emitter-follower circuit, said emitter current source including a bipolar transistor connected at its base to said reference voltage, and said means to compensate providing the emitter current source with a driving ability that is variable depending on the temperature coefficient.

4. An integrated logical circuit according to claim 3, wherein said temperature coefficient is positive.

5. A clock signal feed system comprising:
means for feeding a clock including a phase information reference clock signal of one frequency;
a plurality of PLL circuit means for generating respective slave output signals in response to said phase information reference clock signal, so that all of the slave output signals are in-phase and higher in frequency than the frequency of the phase information reference clock signal; and
a plurality of optical fiber cables respectively coupled between said means for feeding a clock and each of said PLL circuit means for feeding said phase information reference clock signal to each of said PLL circuits.

6. A logic circuit comprising:
a plurality of clocked devices at different physical locations throughout the circuit and each having a clock signal input;
means for generating a clock having frequency information and phase information;
a plurality of clock adjustor means at different locations throughout said circuit, each having a clock input and a slave clock output, for receiving said clock at said clock input and producing a corresponding slave clock at its slave clock output;
first transmission line means between each of said slave clock outputs and a clock signal input for a corresponding one of said clocked devices;
second transmission line means operatively connecting said means for generating a clock and each of said clock adjustor means for feeding the clock to the clock input of each of said clock adjustor means with a substantially equal clock delay;
means providing a feedback signal to at least one of said clock adjustor means correlated to the slave clock delay between said one of said clock adjustor means and one of the clocked devices receiving the slave clock from said one of said clock adjustor means;
said one of said clock adjustor means comparing said feedback signal with a reference and adjusting the delay of said slave clock in response to said comparison;
said one of said clock adjustor means comparing said feedback signal with the phase information of said clock and shifting the phase of said slave clock in response to said comparison;

each of said clock adjustor means being substantially identical to said one of said clock adjustor means and shifting its slave clock phase so that the phase relationship between its feedback signal and the clock is substantially identical to the same relationship for the other of said clock adjustor means; and
said second transmission line means including transmission lines of equal length between each of said clock adjustor means and said means for generating a clock.

7. The logic circuit according to claim 6, wherein each of said clock adjustor means includes a phase comparator comparing the phase of said clock and said feedback signal to produce a comparison signal, and variable delay means for producing a variable delay between said clock and said slave clock in response to said comparison signal.

8. The logic circuit according to claim 7, wherein each of said clock adjustor means further includes a frequency divider for reducing the frequency of said clock after passing through said variable delay means to provide a fixed frequency for said slave clock that is a whole number multiple of 2 less than the frequency of said clock; and
said means for generating a clock producing said clock with a reference clock signal having the phase information and a separate master clock signal having the frequency information, so that said master clock has a frequency that is said whole number multiple of 2 greater than said clock having said phase information.

9. A logic circuit comprising:
a plurality of clocked devices at different physical locations throughout the circuit and each having a clock signal input;
means for generating a clock having frequency information and phase information;
a plurality of clock adjustor means at different locations throughout said circuit, each having a clock input and a slave clock output, for receiving said clock at said clock input and producing a corresponding slave clock at its slave clock output;
first transmission line means between each of said slave clock outputs and a clock signal input for a corresponding one of said clocked devices;
second transmission line means operatively connecting said means for generating a clock and each of said clock adjustor means for feeding the clock to the clock input of each of said clock adjustor means with a substantially equal clock delay;
means providing a feedback signal to at least one of said clock adjustor means correlated to the slave clock delay between said one of said clock adjustor means and one of the clocked devices receiving the slave clock from said one of said clock adjustor means;
said one of said clock adjustor means comparing said feedback signal with a reference and adjusting the delay of said slave clock in response to said comparison;
said means providing a feedback signal including third transmission line means having a delay substantially correlated to the slave clock delay of said first transmission line means for feeding the slave clock signal from its clocked device back to said one of said clock adjustor means with the delay correlated to the delay in said first transmission line means.

10. A logic circuit comprising:
a plurality of clocked devices at different physical locations throughout the circuit and each having a clock signal input;
means for generating a clock having frequency information and phase information;
a plurality of clock adjustor means at different locations throughout said circuit, each having a clock input and a slave clock output, for receiving said clock at said clock input and producing a corresponding slave clock at its slave clock output;
first transmission line means between each of said slave clock outputs and a clock signal input for a corresponding one of said clocked devices;
second transmission line means operatively connecting said means for generating a clock and each of said clock adjustor means for feeding the clock to the clock input of each of said clock adjustor means with a substantially equal clock delay;
means providing a feedback signal to at least one of said clock adjustor means correlated to the slave clock delay between said one of said clock adjustor means and one of the clocked devices receiving the slave clock from said one of said clock adjustor means;
said one of said clock adjustor means comparing said feedback signal with a reference and adjusting the delay of said slave clock in response to said comparison;
wherein there are a plurality of said means providing a feedback signal providing said feedback signal to respective ones of said clock adjustor means with a phase delay relative to said slave clock at said ones of said clock adjustor means output that has a fixed correlation to the delay in the slave clock between said ones of said clock adjustor means and their clocked devices, respectively which which fixed correlation is the same for each combination of clock adjustor means and clocked device; and
wherein said second transmission lines means include transmission lines of equal length between each of said clock adjustor means and said means for generating a clock.

11. The logic circuit according to claim 10, wherein said ones of said clock adjustor include a phase comparator comparing the phase of said clock and said feedback signal to produce a comparison signal, and variable delay means for producing a variable delay between said clock and said slave clock in response to said comparison signal.

12. A logic circuit comprising:
a plurality of clocked devices at different physical locations throughout the circuit and each having a clock signal input;
means for generating a clock having frequency information and phase information;
a plurality of clock adjustor means at different locations throughout said circuit, each having a clock input and a slave clock output, for receiving said clock at said clock input and producing a corresponding slave clock at its slave clock output;
first transmission line means between each of said slave clock outputs and a clock signal input for a corresponding one of said clocked devices;
second transmission line means operatively connecting said means for generating a clock and each of said clock adjustor means for feeding the clock to the clock input of each of said clock adjustor means with a substantially equal clock delay;
means providing a feedback signal to at least one of said clock adjustor means correlated to the slave clock delay between said one of said clock adjustor means and one of the clocked devices receiving the slave clock from said one of said clock adjustor means;
said one of said clock adjustor means comparing said feedback signal with a reference and adjusting the delay of said slave clock in response to said comparison;
wherein said second transmission line means are optical fiber cables extending between said means for generating a clock and each of said clock adjustor means.

13. A logic circuit comprising:
a plurality of clocked devices at different physical locations throughout the circuit and each having a clock signal input;
means for generating a clock having frequency information and phase information;
a plurality of clock adjustor means at different locations throughout said circuit, each having a clock input and a slave clock output, for receiving said clock at said clock input and producing a corresponding slave clock at its slave clock output;
first transmission line means between each of said slave clock outputs and a clock signal input for a corresponding one of said clocked devices;
second transmission line means operatively connecting said means for generating a clock and each of said clock adjustor means for feeding the clock to the clock input of each of said clock adjustor means with a substantially equal clock delay;
means providing a feedback signal to at least one of said clock adjustor means correlated to the slave clock delay between said one of said clock adjustor means and one of the clocked devices receiving the slave clock from said one of said clock adjustor means;
said one of said clock adjustor means comparing said feedback signal with a reference and adjusting the delay of said slave clock in response to said comparison;
wherein each of said second transmission line means is of identical length; and said first transmission line means are of different lengths.

14. A logic circuit comprising:
a plurality of clocked devices at different physical locations throughout the circuit and each having a clock signal input;
means for generating a clock having frequency information and phase information;
a plurality of clock adjustor means at different locations throughout said circuit, each having a clock input and a slave clock output, for receiving said clock at said clock input and producing a corresponding slave clock at its slave clock output;
first transmission line means between each of said slave clock outputs and a clock signal input for a corresponding one of said clocked devices;
second transmission line means operatively connecting said means for generating a clock and each of said clock adjustor means for feeding the clock to the clock input of each of said clock adjustor means with a substantially equal clock delay;

means providing a feedback signal to at least one of said clock adjustor means correlated to the slave clock delay between said one of said clock adjustor means and one of the clocked devices receiving the slave clock from said one of said clock adjustor means;

said one of said clock adjustor means comparing said feedback signal with a reference and adjusting the delay of said slave clock in response to said comparison;

wherein said transmission line means include transmission lines of equal length between each of said clock adjustor means and said means for generating a clock.

15. An integrated logical circuit comprising:

clock means for feeding a clock having frequency information and phase information;

a plurality of clock adjustor means for respectively generating clock signals having the same phases in response to the frequency information and phase information fed from said clock means;

means for maintaining delay times between said clock means and said clock signals of each clock adjustor means to be substantially equal, including transmitting the clock from said clock means to each of said clock adjustor means with substantially equal delay times and providing the clock transmission length substantially equal between said clock means and each of said clock adjustor means.

16. An integrated logical circuit according to claim 15, constructed entirely on a single chip.

17. An integrated logical circuit comprising:

clock means for feeding a clock having frequency information and phase information;

a plurality of clock adjustor means for respectively generating clock signals having the same phases in response to the frequency information and phase information fed from said clock means;

means for maintaining delay times between said clock means and said clock signals of each clock adjustor means to be substantially equal, including transmitting the clock from said clock means to each of said clock adjustor means with substantially equal delay times and including the spacings between said clock means and each of said clock adjustor means being substantially equal.

18. An integrated logical circuit according to claim 17, constructed entirely on a single chip.

19. An integrated logical circuit comprising:

clock means for feeding a clock having frequency information and phase information;

a plurality of clock adjustor means for respectively generating clock signals having the same phases in response to the frequency information and phase information fed from said clock means;

means for maintaining delay times between said clock means and said clock signals of each clock adjustor means to be substantially equal, including transmitting the clock from said clock means to each of said clock adjustor means with substantially equal delay times and including separate optical fibers transmitting the clock between said clock means and each of said clock adjustor means.

20. An integrated logical circuit according to claim 19, constructed entirely on a single chip.

* * * * *